(12) United States Patent
Hsu et al.

(10) Patent No.: US 10,340,450 B2
(45) Date of Patent: Jul. 2, 2019

(54) RESISTIVE RANDOM ACCESS MEMORY STRUCTURE AND FORMING METHOD THEREOF

(71) Applicant: Winbond Electronics Corp., Taichung (TW)

(72) Inventors: Po-Yen Hsu, New Taipei (TW); Chih-Cheng Fu, New Taipei (TW); Ting-Ying Shen, Chiayi (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/660,295

(22) Filed: Jul. 26, 2017

(65) Prior Publication Data
US 2018/0269389 A1    Sep. 20, 2018

(30) Foreign Application Priority Data
Mar. 16, 2017    (TW) .............................. 106108679 A

(51) Int. Cl.
*H01L 45/00* (2006.01)
*G11C 13/00* (2006.01)

(52) U.S. Cl.
CPC ...... *H01L 45/1246* (2013.01); *G11C 13/0002* (2013.01); *G11C 13/0007* (2013.01); *H01L 45/08* (2013.01); *H01L 45/1233* (2013.01); *H01L 45/1253* (2013.01); *H01L 45/1266* (2013.01); *H01L 45/145* (2013.01); *H01L 45/146* (2013.01); *H01L 45/147* (2013.01); *H01L 45/1616* (2013.01); *H01L 45/1675* (2013.01)

(58) Field of Classification Search
CPC . H01L 45/08; H01L 45/1233; H01L 45/1246; H01L 45/1253; H01L 45/146; H01L 45/147; H01L 45/1616; G11C 13/0002; G11C 13/0007
See application file for complete search history.

(56) References Cited

U.S. PATENT DOCUMENTS

2002/0040988 A1*  4/2002  Hidaka ............. H01L 21/76801
                                                                257/296
2003/0008456 A1*  1/2003  Kim ................... H01L 21/28562
                                                                438/240

(Continued)

FOREIGN PATENT DOCUMENTS

TW    201611003 A    3/2016
TW    201614656 A    4/2016

*Primary Examiner* — Feifei Yeung Lopez
(74) *Attorney, Agent, or Firm* — Muncy, Geissler, Olds & Lowe, P.C.

(57) ABSTRACT

A resistive random access memory (RRAM) structure and its forming method are provided, which includes an interlayer dielectric layer on a substrate. The interlayer dielectric layer is a dielectrics including oxygen. The RRAM structure also includes an oxygen-diffusion barrier layer on the interlayer dielectric layer, and a bottom electrode layer on the oxygen-diffusion barrier layer. The bottom electrode layer includes a first electrode layer, a first oxygen-rich layer on the first electrode layer, and a second electrode layer on the first oxygen-rich layer. The RRAM structure also includes a resistance switching layer on the bottom electrode layer, and a top electrode layer on the resistance switching layer.

16 Claims, 3 Drawing Sheets

(56) References Cited

U.S. PATENT DOCUMENTS

| | | | |
|---|---|---|---|
| 2004/0061141 A1* | 4/2004 | Kondoh | H01L 51/0059 257/202 |
| 2009/0086521 A1* | 4/2009 | Herner | G11C 11/5685 365/63 |
| 2010/0078758 A1* | 4/2010 | Sekar | H01L 27/2418 257/530 |
| 2013/0130464 A1* | 5/2013 | Lee | H01L 45/08 438/381 |
| 2013/0221307 A1* | 8/2013 | Wang | H01L 45/10 257/2 |
| 2014/0312293 A1* | 10/2014 | Mikawa | H01L 45/08 257/4 |
| 2015/0070965 A1* | 3/2015 | Bandyopadhyay | G11C 13/0059 365/148 |
| 2015/0171142 A1* | 6/2015 | Kawashima | H01L 27/2463 257/4 |
| 2016/0218283 A1 | 7/2016 | Trinh et al. | |
| 2016/0284992 A1* | 9/2016 | Lee | H01L 45/08 |

* cited by examiner

US 10,340,450 B2

RESISTIVE RANDOM ACCESS MEMORY STRUCTURE AND FORMING METHOD THEREOF

CROSS-REFERENCE TO RELATED APPLICATIONS

This Application claims priority of Taiwan Patent Application No. 106108679, filed on Mar. 16, 2017, the entirety of which is incorporated by reference herein.

BACKGROUND OF THE INVENTION

Field of the Invention

The present invention relates to a memory device, and in particular relates to a resistive random access memory structure and the forming method thereof.

Description of the Related Art

Resistive random access memory (RRAM) has advantages such as simple structure, small area, low operating voltage, fast operating speed, long memory time, multi-state memory, and low power consumption. Hence RRAM has a great potential to replace the current flash memory to be the mainstream of non-volatile memory in the next generation.

For memory industries, it is desirable to provide advances in RRAM by increasing the yield and reliability of the RRAM.

BRIEF SUMMARY OF THE INVENTION

According to an embodiment, a resistive random access memory structure is disclosed, including an interlayer dielectric (ILD) layer formed on a substrate, wherein the ILD layer is a dielectrics including oxygen. An oxygen diffusion barrier layer is formed on the ILD layer. A bottom electrode layer is formed on the oxygen diffusion barrier layer, wherein the bottom electrode layer includes a first electrode layer formed on the oxygen diffusion barrier layer, a first oxygen-rich layer formed on the first electrode layer; and a second electrode layer formed on the first oxygen-rich layer. A resistive switching layer is formed on the bottom electrode layer. A top electrode layer is formed on the resistive switching layer.

According to another embodiment, a method of forming a resistive random access memory structure is disclosed, including forming an ILD layer on a substrate, wherein the ILD later is a dielectrics including oxygen. An oxygen diffusion barrier layer is formed on the ILD layer. A conductive layer is formed in the oxygen diffusion barrier layer and the ILD layer. A bottom electrode layer is formed on the oxygen diffusion barrier layer and the conductive structure, wherein the formation of the bottom electrode layer includes forming a first electrode layer on the oxygen diffusion barrier layer, forming an oxygen-rich layer on the first electrode layer, and forming a second electrode layer on the oxygen-rich layer. A resistive switching layer is formed on the bottom electrode layer. A top electrode layer is faulted on the resistive switching layer.

DETAILED DESCRIPTION OF THE INVENTION

Figure 1:
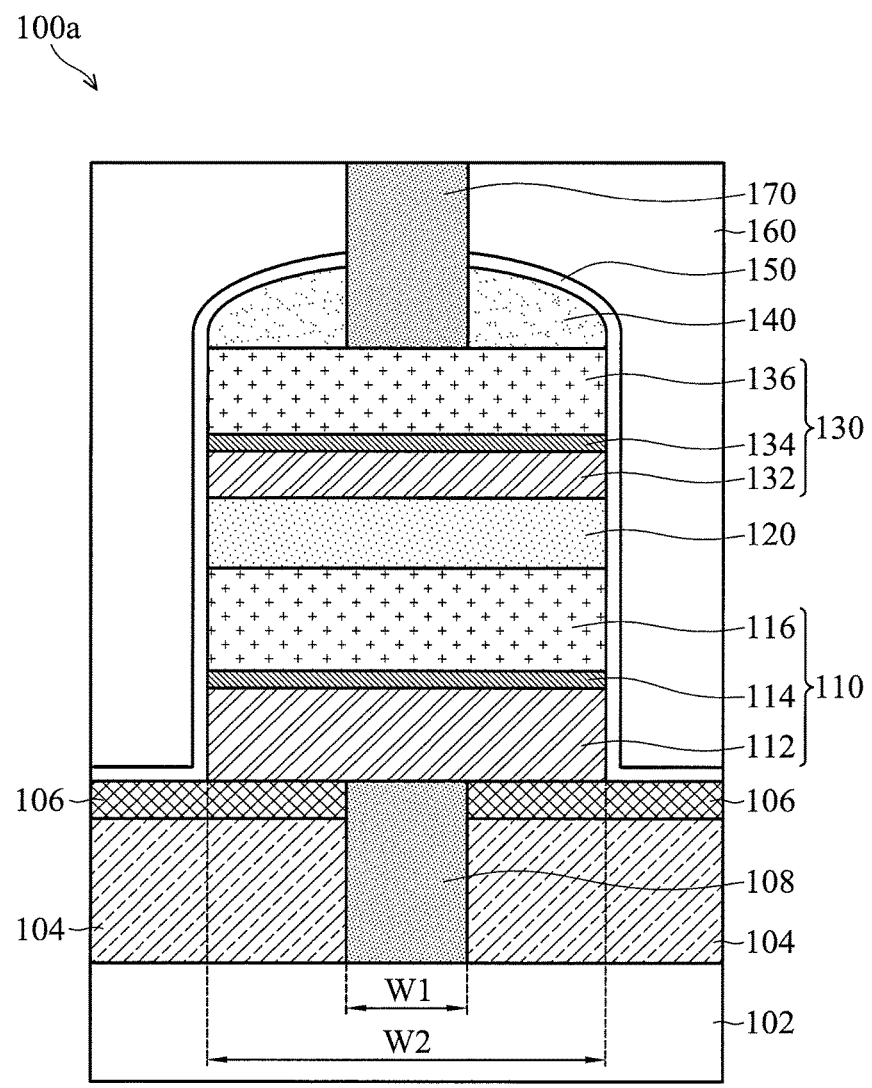
FIG. 1 is a cross-sectional view of a RRAM structure in accordance with an embodiment.

The present invention can be more fully understood by reading the subsequent detailed description and examples with references made to the accompanying drawings, wherein:

The embodiments of the invention provide a RRAM structure and the forming method thereof, FIG. 1 is a cross-sectional view of a RRAM structure 100a in accordance with an embodiment.

Referring to FIG. 1, a substrate 102 is provided. The substrate 102 may include a bulk semiconductor substrate (e.g. silicon substrate), a compound semiconductor substrate (e.g. IIIA-VA group semiconductor substrate), a silicon on insulator (SOI) substrate or another suitable substrate. The substrate 102 may be a doped or an undoped semiconductor substrate. In this embodiment, the substrate 102 is a silicon substrate.

Afterwards, an interlayer dielectric (ILD) layer 104 is formed on the substrate 102. The ILD layer 104 may include suitable dielectrics, such as oxides or oxynitrides. In this embodiment, the ILD layer 104 is an oxygen-containing dielectric, such as silicon oxide.

Afterwards, an oxygen diffusion barrier layer 106 is formed on the ILD layer 104. The oxygen diffusion barrier layer 106 may prevent oxygen in the ILD layer 104 from diffusing into the subsequently formed bottom electrode, and thus the yield and reliability of the final product may be enhanced, and the details will be discussed later. In some embodiments, the oxygen diffusion barrier layer 106 may include insulators or dielectrics. In some embodiments, the oxygen diffusion barrier layer 106 may include silicon nitride, silicon carbide, silicon carbonitride or other oxygen-free barrier materials. In some embodiments, the oxygen diffusion barrier layer 106 may be formed by sputtering, chemical vapor deposition (CVD) or another suitable deposition process. In this embodiment, the oxygen diffusion barrier layer 106 is silicon nitride with a thickness of 20-50 nm.

Afterwards, a patterning process is performed on the oxygen diffusion barrier layer 106 and the ILD layer 104 to form a via opening. Then a dielectric is filled into the via opening, and the excess dielectric on the oxygen diffusion barrier layer 106 is removed by a planarization process (e.g. chemical mechanical polishing, CMP) to form a conductive structure 108 in the oxygen diffusion barrier layer 106 and the ILD layer 104.

One function of the conductive structure 108 is to block the oxygen diffusion in the ILD layer 104. Hence, if a conductive material which cannot block the oxygen diffusion (e.g. copper or copper alloy) is chosen, oxygen in the ILD layer 104 may diffuse into the subsequently formed bottom electrode through the conductive structure 108, thereby adversely affecting the yield and reliability of the final product.

On the other hand, the conductive material of the conductive structure 108 may diffuse into the subsequently formed resistive switching layer if a material with high diffusing ability is chosen to form the conductive structure 108. Hence, the resistive switching layer may not be able to convert to a high resistance state, thus causing errors while reading/writing data, thereby adversely affecting the yield and reliability of the final product as well.

In some embodiments, the conductive material may include suitable metals, such as tungsten, aluminum or alloys thereof. In this embodiment, the conductive material is tungsten. When a CMP process is performed to remove the excess conductive material (tungsten), the oxygen diffusion barrier 106 formed of silicon nitride may act as an etch stop layer.

As shown in FIG. 1, the top surface of the conductive structure 108 is coplanar with the top surface of the oxygen diffusion barrier layer 106. Such a structure may prevent the poor uniformity problem of the RRAM, and thus the yield and reliability of the final product may be enhanced.

Afterwards, a bottom electrode layer 110 is formed on the oxygen diffusion barrier layer 106 and the conductive structure 108. As shown in FIG. 1, the bottom electrode layer is a trilayer stacking structure, which is formed by sequentially forming a first electrode layer 112, a first oxygen-rich layer 114 and a second electrode layer 116 on the oxygen diffusion barrier layer 106.

The bottom electrode layer 110 may electrically connect to the conductive structure 108 through the first electrode layer 112, and may further electrically connect to external circuits through the conductive structure 108. The first electrode layer 112 may include suitable conductive materials, such as metals like titanium or the like, or alloys thereof. The first electrode layer 112 may be formed by a physical vapor deposition (PVD) process or another suitable deposition process. In this embodiment, the first electrode layer 112 is titanium nitride with a thickness of 5-30 nm.

The bottom electrode layer 110 may be electrically connected to the subsequently formed resistive switching layer by the second electrode layer 116, to apply an operating voltage to the resistive switching layer. The second electrode layer 116 may include suitable conductive materials, such as TiN, AlN, TiAlN, HfN or AlHfN. The second electrode layer 116 may be formed by a PVD process or another suitable process. In this embodiment, the second electrode layer 116 is TiN with a thickness of 5-30 nm.

Because of the presence of the oxidation reactions in the process, oxygen may exist in the first electrode layer 112. Those oxidation reactions are described in detail as follow:

(1) The oxidation reaction caused by the ILD layer 104: if the first electrode layer 112 is directly formed on the ILD layer 104, the oxygen in the ILD layer 104 may diffuse into the first electrode layer 112 and causes oxidation reaction.

(2) The oxidation reaction caused by sidewall spacer: a sidewall spacer will be formed to protect and insulate the RRAM structure during the subsequent processes, and the structure configuration of the sidewall spacer will be described in the subsequent paragraphs. Water vapor may be used during the deposition the sidewall spacer, and the oxygen generates from the dissociation of water vapor may enter the first electrode layer 112 and the second electrode layer 116 and causes oxidation reaction. Furthermore, the sidewall spacer may include metal oxides or metal oxynitrides, so that the oxygen in the sidewall spacer may enter the first electrode layer 112 and the second electrode layer 116, and causes oxidation reaction.

(3) The oxidation reaction is caused by thermal processes: thermal processes such as annealing may be performed after forming the RRAM structure. If the first electrode layer 112 directly contacts the underlying ILD layer 104, the oxygen in the ILD layer 104 may diffuse into the first electrode layer 112 during the thermal process, and causes oxidation reaction.

If the oxygen in the first electrode layer 112 further diffuses into the second electrode layer 116, the second electrode layer 116 may be oxidized, and thus causes the following problems.

(I) The non-uniformity of the resistance: the resistance of the RRAM structure may be increased by the oxidation of the second electrode layer 116. The depth, the location and the direction of the oxygen diffusing into the second electrode layer 116 cannot be predicted or be anticipated, so that the oxidation degree and the location of the second electrode layer 116 cannot be controlled as well. For a single RRAM structure, since the oxidation degree cannot be predicted, its resistance cannot be controlled. For the RRAM structures on the same wafer, the oxidation degree of the RRAM structures on the peripheral portion and the center portion of the wafer may be different because of the temperature difference between the peripheral portion and the center portion of the wafer during the thermal process. Hence, the degree of increased resistance of the RRAM structures may vary depending on the relative positions on the wafer, thus resulting in uncontrollable difference. The yield and reliability of the final product may be decreased.

(II) The non-uniformity of conversion: because of the resistance difference described above, the electric field strength received by each of the resistive switching layers of the RRAM structures on the same wafer may be different even when the same voltage is applied. For a single RRAM structure, the applied voltage may not be controlled because the resistance of the RRAM structure cannot be predicted. Hence, the location where the oxygen vacancy filaments (conductive paths) are formed cannot be controlled, and thus causes non-uniformity of the oxygen vacancy filaments formation. For example, the shapes or locations of the oxygen vacancy filaments may not be uniform, or the oxygen vacancy filaments are not formed in some regions of the resistive switching layer where the electric field is not strong enough. As such, the switching resistance for a single RRAM structure may vary at each switch. As described above, the degree of increased resistance of the RRAM structures may vary depending on the relative positions on the wafer, thus resulting in difference. The yield and reliability of the final product will be decreased as a result.

Referring to FIG. 1, in this embodiment the first electrode layer 112 is formed on the oxygen diffusion barrier layer 106 and the conductive structure 108, but does not directly contact the ILD layer 104. The advantage of the present embodiment is that the oxygen that diffuses through the ILD layer 104 to the first electrode layer 112 may be blocked. Hence the problems related to non-uniformity of resistance and non-uniformity of conversion, as have been described above, may be solved, thereby increasing the yield and reliability of the final product.

Still referring to FIG. 1, the first oxygen-rich layer 114 is formed between the first electrode layer 112 and the second electrode layer 116 in this embodiment. Even if a small amount of oxygen may be present in the first electrode layer 112, the oxygen-rich layer 114 may prevent oxygen from diffusing through the first electrode layer 112 into the second electrode layer 116. As such, it may also significantly prevent the oxygen in the ILD layer 104 from diffusing through the first electrode layer 112 to the second electrode layer 116. Hence the aforementioned problems with non-uniformity of resistance and non-uniformity of conversion may be further reduced, and the yield and reliability of the final product may be increased further.

In some embodiments, the first oxygen-rich layer 114 may include metal oxide, metalloid oxide, metal oxynitride or a combination thereof. In detail, if the bonding between metal (or metalloid) and oxygen in the material is relatively strong and the oxygen content in the material is relatively saturated, the material may effectively block oxygen. Hence, such a material may be chosen as the material for the first oxygen-rich layer 114.

In some embodiments, the first oxygen-rich layer 114 may include metal oxide or metalloid oxide. In such embodiments, oxygen may be effectively blocked even if the thickness of the first oxygen-rich layer 114 is relatively small. In other embodiments, the first oxygen-rich layer 114 may include metal oxynitride. In such embodiments, since the ability of blocking oxygen of the metal oxynitride is lower than that of the metal oxide, the thickness of the first oxygen-rich 114 may be relatively large in order to have the same oxygen blocking ability as the metal oxide (or the metalloid oxide). However, metal oxynitride has lower resistance than metal oxide, the resistance of the first oxygen-rich layer 114 may not become too high in spite of the greater thickness. In some embodiments, the first oxygen-rich layer 114 may include $Al_2O_3$, $SiO_2$, $HfO_2$ or TiON.

On the other hand, since the resistance of the material of the first oxygen-rich layer 114 is higher than that of metal, the thickness of the first oxygen-rich layer 114 may be controlled in a specific range in order to decrease the resistance of the RRAM structure. If the first oxygen-rich layer 114 is too thin, it may not effectively block oxygen. Conversely, if the first oxygen-rich layer 114 is too thick, it would be disadvantageous for decreasing the resistance and for minimizing the RRAM structure. In some embodiments, the thickness of the first oxygen-rich layer 114 is 0.1-5 nm. In some embodiments, the thickness of the first oxygen-rich layer 114 is 0.2-3 nm. In some embodiments, the thickness of the first oxygen-rich layer 114 is 0.3-1 nm.

In some embodiments, atomic layer deposition (ALD) or another suitable deposition process may be utilized to precisely control the thickness of the first oxygen-rich layer 114 to nanoscale. In this embodiment, the first oxygen-rich layer 114 is aluminum oxide with a thickness of 0.3 nm, and is formed by ALD.

In some other embodiments, reaction gases including oxygen may be introduced after the first electrode layer 112 is formed. The oxygen-rich layer 114 may be formed by reacting the reaction gases with the metal in the first electrode layer 112. In such embodiments, the material of the oxygen-rich layer 114 may be metal oxide or metal oxynitride, depending on the reaction gases. For instance, the first electrode layer 112 includes titanium, and $N_2O$ may be introduced as the reaction gas to form TiON as the oxygen-rich layer 114 in some embodiments.

After that, as shown in FIG. 1, a resistive switching layer 120 is formed on the bottom electrode layer 110. The resistance state of the RRAM structure may be switched by the resistive switching layer 120. When a formation voltage or a writing voltage is applied, the oxygen anions in the resistive switching layer 120 may enter the subsequently formed third electrode layer, and oxygen vacancy filaments (i.e. conductive paths) may be formed by the equivalent positive-charged oxygen vacancies remained in the resistive switching layer 120. Hence, the resistive switching layer is transformed from a high resistance state to a low resistance state. On the other hand, when an erase voltage is applied, the oxygen anions in the third electrode layer may return into the resistive switching layer 120 and combine with the equivalent positive-charged oxygen vacancies, and thus eliminates the oxygen vacancy filament. The resistive switching layer 120 thus transforms from a low resistance state to a high resistance state.

In some embodiments, the resistive switching layer 120 may include transition metal oxide or another suitable resistance switching material. In some embodiments, the resistive switching layer 120 may include $Ta_2O_5$, $HfO_2$ or $ZrO_2$.

Suitable material may be chosen as the resistive switching layer 120 based on the material of the first oxygen-rich layer 114. In detail, the material of the first oxygen-rich layer 114 is different from that of the resistive switching layer 120, and the bonding between metal (or metalloid) and oxygen in the first oxygen-rich layer 114 is stronger than that in the resistive switching layer 120. Therefore, the metal (or metalloid) and the oxygen in the first oxygen-rich layer 114 may not be separated from each other even if the writing voltage is applied to separate the oxygen ions and the metal cations in the resistive switching layer 120. As a result, the oxygen diffusion may be effectively blocked by the first oxygen-rich layer 114. In some embodiments, if the first oxygen-rich layer 114 is $HfO_2$, the material of the resistive switching layer 120 may be HfSiON or HfON.

Then a top electrode layer 130 is formed on the resistive switching layer 120. As shown in FIG. 1, the top electrode layer 130 is a trilayer stacking structure, which is formed by sequentially forming a third electrode layer 132, an oxygen stopping layer 134 and a fourth electrode layer 136 on the resistive switching layer 120.

The top electrode layer 130 may be electrically connected to the resistive switching layer 120 through the third electrode layer 132 for applying an operation voltage to the resistive switching layer 120. Therefore, the materials of the third electrode layer 132 may include suitable metals or alloys thereof, such as titanium, tantalum, hafnium, zirconium and other suitable metals or alloys thereof.

If the oxygen ions in the resistive switching layer 120 diffuse into the third electrode layer 132 when no voltage is applied, switching errors or device failure may occur. To prevent this problem, the metal which is included in the third electrode layer 132 may be different from that of the resistive switching layer 120.

Furthermore, if the second electrode layer 116 which is located above the resistive switching layer 120 and the third electrode layer 132 which is located below the resistive switching layer 120 use the same material, the oxygen ions in the resistive switching layer 120 may enter either the third electrode layer 132 above the resistive switching layer 120 or the second electrode layer 116 below the resistive switching layer 120. In other words, the diffusing direction of the oxygen ions in the resistive switching layer 120 may not be controlled. In some embodiments, the second electrode layer 116 and the third electrode layer 132 may be formed of different materials in order to prevent this problem. In this embodiment, the second electrode layer 116 is titanium nitride, and the third electrode 132 is titanium.

The top electrode layer 130 may electrically connect to a top contact 170 via the fourth electrode layer 136, and may further electrically connect to external circuits through the top contact 170. The material and the forming method of the fourth electrode layer 136 will not be emphasized or described here in detail.

Oxygen ions from the resistive switching layer 120 may be stored in the third electrode layer 132 when the resistive switching layer 120 transforms from a high resistance state to a low resistance state. If those oxygen ions diffuse into the fourth electrode 136, they may not be able to return to the resistive switching layer 120 when the erase voltage is applied, and thus they cannot combine with the oxygen vacancies in the resistive switching layer 120. Therefore, the resistive switching layer 120 cannot transform to the high resistance state, and causes resistance switching errors.

In this embodiment, as shown in FIG. 1, the oxygen stopping layer 134 is formed between the third electrode layer 132 and the fourth electrode layer 136. The oxygen stopping layer 134 may prevent the oxygen ions stored in the third electrode layer 132 from diffusing into the fourth electrode layer 136. In some embodiments, the material of the oxygen stopping layer 134 may include undoped or doped HfAlO. When the oxygen stopping layer 134 is doped HfAlO, suitable dopants may include N, Si or C.

Then a hard mask layer 140 is formed on the top electrode layer 130, and the top electrode layer 130, the resistive switching layer 120 and the bottom electrode layer 110 are patterned by using the hard mask layer 140 as an etching mask, as shown in FIG. 1.

Then a sidewall spacer 150 which covers the patterned hard mask layer 140, the top electrode layer 130, the resistive switching layer 120, the bottom electrode layer 110 and the oxygen diffusion barrier layer 106 is formed, as shown in FIG. 1.

As described above, the oxygen created in the deposition process of the sidewall spacer 150 may enter the first electrode layer 112 and the second electrode layer 116, thus decreasing the yield and reliability of the final product. Furthermore, the sidewall spacer 150 directly contacts the peripheral region of the first electrode layer 112 and the second electrode layer 116. Hence the oxidation reaction is liable to take place in this peripheral region rather than in the center region of the first electrode layer 112 and the second electrode layer 116. In this embodiment, the width W1 of the conductive structure 108 is less than the width W2 of the first electrode layer 112 and the second electrode layer 116, as shown in FIG. 1. The center region of the first electrode layer 112 and the second electrode layer 116 (i.e. the region where the first electrode layer 112 overlaps with the conductive structure 108) has a stronger electric field when a voltage is applied. Hence, even if an oxidation reaction takes place in the peripheral region of the first electrode layer 112 and the second electrode layer 116, the negative influences to the yield and reliability of the final product may be reduced.

In some embodiments, the sidewall spacer 150 may include metal oxide, metal oxynitride or another suitable dielectric, and may be formed by ALD, CVD or another suitable deposition process.

Then a dielectric layer 160 is formed on the sidewall spacer 150. The dielectric layer 160 may be formed by conventional dielectrics or deposition processes. After that, a patterning process is performed to form an opening through the dielectric layer 160, the sidewall spacer 150 and the hard mask 140 to expose a portion of the top surface of the fourth electrode layer 136. Then a top contact 170 is formed by filling conductive materials into the opening, thereby completing the formation of the RRAM structure 100a, as shown in FIG. 1.

The top contact 170 may be formed by conventional conductive materials or deposition processes. In some embodiments, in order to simplify or to integrate the processes, the materials, the thickness and the forming methods of the top contact 170 may be the same or similar as those of the conductive structure 108, and it will not be described again in detail.

Figure 2:
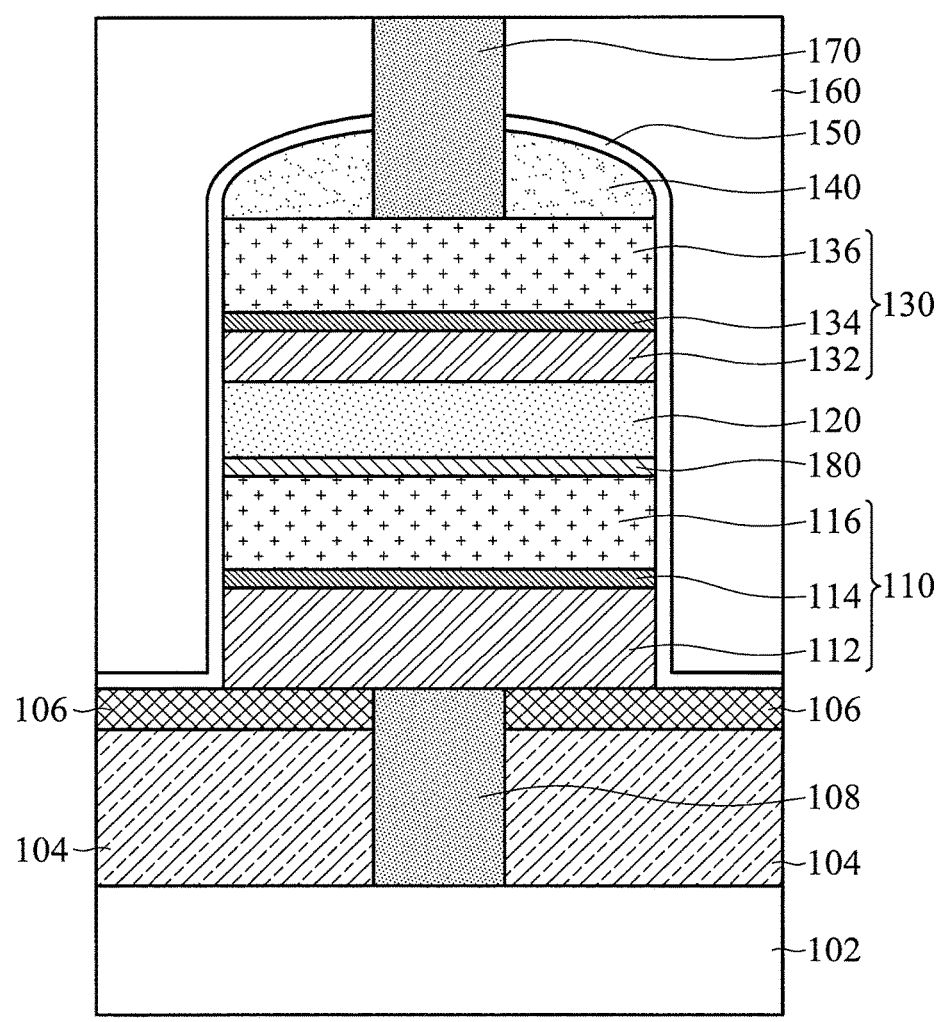
FIG. 2 is a cross-sectional view of a RRAM structure in accordance with another embodiment.

FIG. 2 is a cross-sectional view of a RRAM structure 100b in accordance with another embodiment. FIG. 2 is similar to FIG. 1, except that a second oxygen-rich layer 180 is formed on the second electrode layer 116 before the resistive switching layer 120 is formed. Similar reference numbers are used to denote similar elements in FIGS. 2 and 1. For brevity, the same elements and the processing steps as FIG. 1 will not be described again.

As described above, the oxygen ions stored in the third electrode layer 132 may move toward the resistive switching layer 120 when the erase voltage is applied. If the oxygen ions are driven by the erase voltage to enter the second electrode layer 116, the second electrode layer 116 may be oxidized. Hence it may cause state-switch errors, or the problems of non-uniform resistance or non-uniform conversion, as described above, may happen.

In some embodiments, the second oxygen-rich layer 180 is formed between the resistive switching layer 120 and the second electrode layer 116. The second oxygen-rich layer 180 may block the oxygen in the resistive switching layer 120 from entering into the second electrode layer 116, and may prevent state transformation errors, non-uniform resistance and the non-uniform conversion problems, and may further enhance the yield and reliability of the final product. In some embodiments, the materials, thickness and the forming method of the second oxygen-rich layer 180 may be the same or similar as those of the first oxygen-rich layer 114, and will not be described again in detail.

Similarly, suitable materials may be chosen as the resistive switching layer 120 based on the materials of the second oxygen-rich layer 180. In detail, the material of the second oxygen-rich 180 is different from that of the resistive switching layer 120, wherein the bonding between metal (or metalloid) and oxygen is stronger in the second oxygen-rich layer 180 as compared to the resistive switching layer 120.

Figure 3:
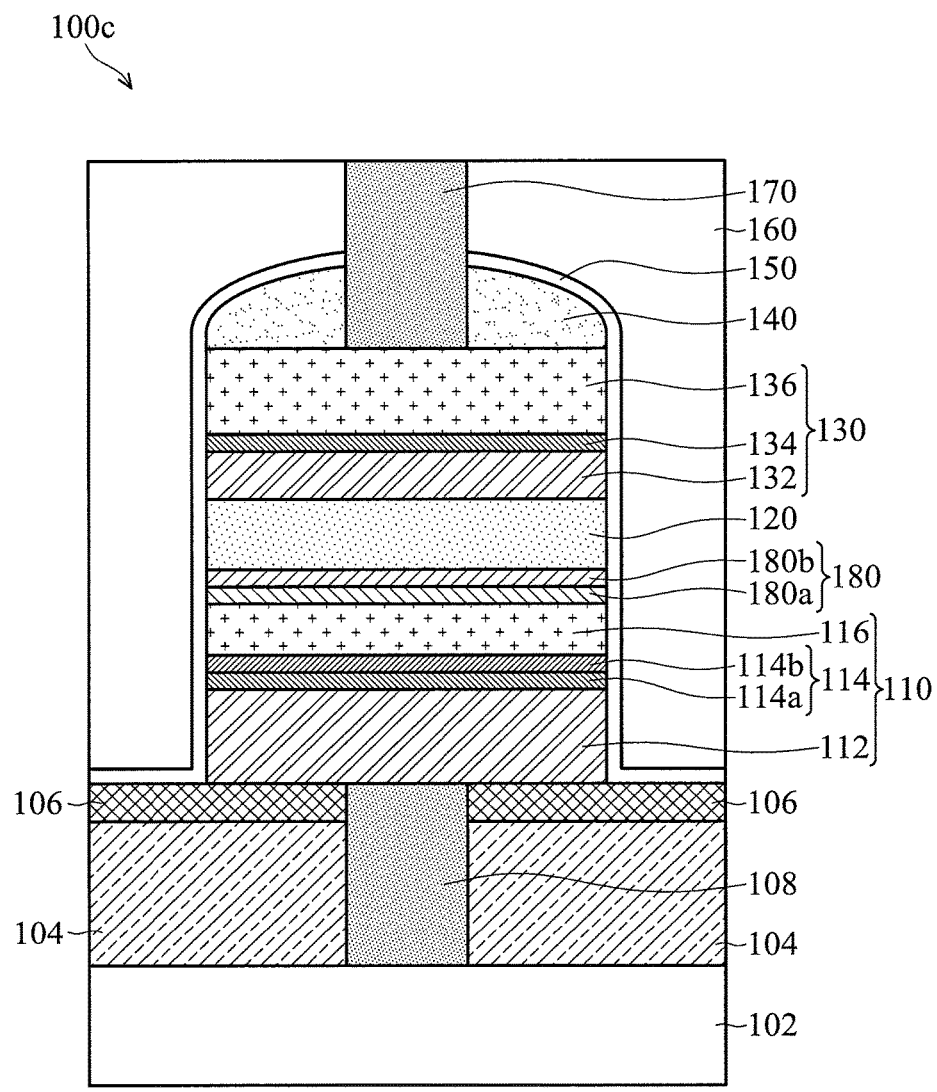
FIG. 3 is a cross-sectional view of a RRAM structure in accordance with a further embodiment.

FIG. 3 is a cross-sectional view of a RRAM structure 100c in accordance with a further embodiment. FIG. 3 is similar to FIG. 2, except that both of the first oxygen-rich layer 114 and the second oxygen-rich layer 180 are bilayer structures. Similar reference numbers are used to denote similar elements in FIGS. 3 and 2. For brevity, the same elements and the processing steps as FIG. 2 will not be described again.

Referring to FIG. 3, in some embodiments, the first oxygen-rich layer 114 is a bilayer stacking structure, which is formed by sequentially forming the first oxygen-rich layer 114a and the first oxygen-rich layer 114b; the second oxygen-rich layer 180 is a bilayer stacking structure, which is formed by sequentially forming the second oxygen-rich layer 180a and the second oxygen-rich layer 180b.

As described above, either metal oxide or metal oxynitride has their own advantages as the oxygen-rich layer material. Hence suitable materials may be combined to be the first oxygen-rich layer 114 and the second oxygen-rich layer 180 based on the actual requirement. For example, in some embodiments, one of the first oxygen-rich layer 114a and the first oxygen-rich layer 114b is metal oxide, and another one is metal oxynitride. In some other embodiments, both of the first oxygen-rich layer 114a and the first oxygen-rich layer 114b are metal oxide (or metal oxynitride), but each of them includes different metals.

It should be understood that the number of layers and the materials for the first oxygen-rich layer 114 and the second oxygen-rich layer 180 shown in FIG. 3 are merely illustrative and should not be construed as a limitation on the scope of the disclosure. For instance, in other embodiments, the first oxygen-rich layer 114 and the second oxygen-rich layer 180 each may independently be a single layer or a multilayer structure, and each of them may independently use same or different oxygen blocking materials. Besides, when the first oxygen-rich layer 114 and the second oxygen-rich layer 180 are bilayer or multilayer structure, the total thickness of each may be in a range of 0.1-5 nm.

In conclusion, the RRAM structure of the embodiments in this disclosure at least include the following advantages:

(1) The first electrode layer is formed on the oxygen diffusion barrier layer and on the conductive structure, and does not directly contact the ILD layer. Hence, the oxygen which diffuses from the ILD layer into the first electrode layer may be significantly decreased or even be totally blocked, and enhances the non-uniformity of the resistance and non-uniformity of the conversion problems. Hence the yield and reliability of the final product may be improved.

(2) The first oxygen-rich layer is formed between the first electrode layer and the second electrode layer. As a result, it may prevent the oxygen from diffusing through the first electrode layer into the second electrode layer, and the problems of the non-uniformity of the resistance and the non-uniformity of the conversion may be further enhanced.

(3) The second oxygen-rich layer is formed between the second electrode layer and the resistive switching layer. Hence the oxygen in the resistive switching layer may be blocked from diffusing into the second electrode layer, and the problems of non-uniformity of resistance and non-uniformity of conversion may be solved.

(4) The width of the conductive structure is less than that of the first electrode layer and the second electrode layer. As a result, the negative influence caused by the oxidation reaction caused at the peripheral portion of the second electrode layer may be reduced.

(5) The first oxygen-rich layer and the second oxygen-rich layer may be formed by the same deposition processes and/or the same materials, and such deposition processes have high compatibility to the existing processes. Hence they may be easily integrated into the existing processes.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive random access memory structure, comprising: an interlayer dielectric (TLD) layer formed on a substrate, wherein the ILD layer is a dielectric comprising oxygen; an oxygen diffusion barrier layer formed on the ILD layer; a bottom electrode layer formed on the oxygen diffusion barrier layer; wherein the bottom electrode layer comprises: a first electrode layer formed on the oxygen diffusion barrier layer; a single layer of a first oxygen-rich layer formed on the first electrode layer; and a second electrode layer formed on the first oxygen-rich layer; a resistive switching layer formed on the bottom electrode layer; a second oxygen-rich layer between the resistive switching layer and the second electrode layer; a third electrode layer formed on the resistive switching layer; a single layer of an oxygen stopping layer formed on the third electrode layer; and a fourth electrode layer formed on the oxygen stopping layer, wherein the single layer of the first oxygen-rich layer directly contacts the first electrode layer and the second electrode layer, and the single layer of the oxygen stopping layer directly contacts the third electrode layer and the fourth electrode layer.

2. The resistive random access memory structure as claimed in claim 1, wherein the first oxygen-rich layer is metal oxide, metalloid oxide or metal oxynitride.

3. The resistive random access memory structure as claimed in claim wherein the first oxygen-rich layer has a thickness of 0.1-5 nm.

4. The resistive random access memory structure as claimed in claim 1, further comprising a conductive structure formed in the ILD layer and the oxygen diffusion barrier layer, wherein a top surface of the conductive structure is level with a top surface of the first oxygen diffusion barrier layer.

5. The resistive random access memory structure as claimed in claim 1, further comprising a conductive structure formed in the ILD layer and the oxygen diffusion barrier layer, and a thickness of the conductive structure is less than a thickness of the bottom electrode layer.

6. The resistive random access memory structure as claimed in claim 1, wherein the oxygen diffusion barrier layer is an insulating material or a dielectrics.

7. The resistive random access memory structure as claimed in claim 1, further comprising a conductive structure formed in the ILD layer and the oxygen diffusion barrier layer, and the conductive structure directly contacts the substrate.

8. The resistive random access memory structure as claimed in claim 7, wherein the second oxygen-rich layer comprises two or more layers.

9. A method of forming a resistive random access memory structure, comprising: forming an ILD layer on a substrate, wherein the ILD later is a dielectric comprising oxygen; forming an oxygen diffusion barrier layer on the ILD layer; forming a conductive structure in the oxygen diffusion barrier layer and the ILD layer; and forming a bottom electrode layer on the oxygen diffusion barrier layer and the conductive structure, wherein forming the bottom electrode layer comprises: forming a first electrode layer on the oxygen diffusion barrier layer; forming a single layer of an oxygen-rich layer on the first electrode layer; and forming a second electrode layer on the oxygen-rich layer; forming a resistive switching layer on the bottom electrode layer; forming a second oxygen-rich layer between the resistive switching layer and the second electrode layer; and forming a third electrode layer on the resistive switching layer; forming a single layer of an oxygen stopping layer on the third electrode layer; and forming a fourth electrode layer on the oxygen stopping layer, wherein the single layer of the oxygen-rich layer directly contacts the first electrode layer and the second electrode layer, the single layer of the oxygen stopping layer directly contacts the third electrode layer and the fourth electrode layer.

10. The method for forming a resistive random access memory structure as claimed in claim 9, wherein the oxygen-rich layer is formed by depositing an oxygen diffusion barrier material on the first electrode layer by atomic layer deposition.

11. The method for forming a resistive random access memory structure as claimed in claim 9, wherein forming the conductive structure comprises:
   patterning the oxygen diffusion barrier layer and the ILD layer to form a via opening after forming the oxygen diffusion barrier layer on the ILD layer;
   filling a conductive material into the via opening to form the conductive structure; and
   removing the conductive material above the oxygen diffusion barrier layer by a planarization process, such that a top surface of the conductive structure is level with a top surface of the oxygen diffusion barrier layer.

12. The method for forming a resistive random access memory structure as claimed in claim 9, wherein forming the oxygen-rich layer comprises:
    introducing an reaction gas including oxygen, to react with a metal of the first electrode layer, to form a metal oxide or a metal oxynitride on the first electrode layer to serve as the oxygen-rich layer.

13. The resistive random access memory structure as claimed in claim 1, wherein the resistive switching layer comprises a top surface contacting with the third electrode layer and a bottom surface contacting with the second electrode layer, wherein the width of the top surface is the same as the width of the bottom surface when viewed along a direction parallel to the resistive switching layer.

14. The resistive random access memory structure as claimed in claim 1, further comprising a conductive structure formed in the ILD layer and the oxygen diffusion barrier layer, wherein the width of the conductive structure is less than the width of the fourth electrode layer.

15. The resistive random access memory structure as claimed in claim 1, wherein the resistive switching layer is a single layer.

16. The resistive random access memory structure as claimed in claim 7, wherein the number of the first oxygen-rich layer is different to the number of the second oxygen-rich layer.

* * * * *